United States Patent [19]

Shoji

[11] Patent Number: 5,418,178

[45] Date of Patent: May 23, 1995

[54] HIGH-DENSITY READ-ONLY MEMORY FABRICATION

[75] Inventor: Masakazu Shoji, Warren, N.J.

[73] Assignee: AT&T Corp., Murray Hill, N.J.

[21] Appl. No.: 261,622

[22] Filed: Jun. 17, 1994

Related U.S. Application Data

[62] Division of Ser. No. 164,278, Dec. 9, 1994.

[51] Int. Cl.$^6$ .......................................... H01L 21/8246
[52] U.S. Cl. ........................................ 437/52; 437/29; 437/40; 437/48; 148/DIG. 88
[58] Field of Search ................... 437/48, 52, 29, 40; 148/DIG. 88; 257/135, 278

[56] References Cited

U.S. PATENT DOCUMENTS

| | | | |
|---|---|---|---|
| 4,067,036 | 1/1978 | Yoshida et al. | 148/DIG. 88 |
| 4,328,511 | 5/1982 | Tasch, Jr. et al. | 257/261 |
| 5,243,209 | 9/1993 | Ishii | 257/263 |
| 5,358,887 | 10/1994 | Hong | 437/915 |

Primary Examiner—Tom Thomas
Attorney, Agent, or Firm—Robert P. Marley

[57] ABSTRACT

A method for fabricating read-only memory ("ROM") devices utilizing junction field-effect transistors ("JFETs") having a conductive channel orthogonally oriented with respect to the surface of the semiconductor material composing the JFET. A fixed-position ion beam is employed to create this narrow gate channel, which extends between the JFET's source and drain contact. Employing such JFETs as basic memory sites within a semiconductor ROM circuit allows for an architecture that conforms to a minimum lattice structure layout. In addition, the resulting ROM offers high speed access of data. Although JFETs have not been utilized as the transistor of choice within ROMs because of their seemingly inferior performance when compared to MOSFETs, the invention provides a novel architecture which significantly enhances the practicality of the JFET as a memory device.

5 Claims, 2 Drawing Sheets

# HIGH-DENSITY READ-ONLY MEMORY FABRICATION

CROSS-REFERENCE TO RELATED APPLICATION

This application is a division of U.S. application Ser. No. 08/164,278, which was filed on Dec. 9, 1994.

TECHNICAL FIELD

The invention relates to electronic information storage devices, and in particular, to the fabrication read-only storage devices.

BACKGROUND OF THE INVENTION

Typically, large arrays of field-effect transistors ("FETs") fabricated on a single semiconductor chip are employed as read-only memories ("ROMs") for the storage of digital data. In general, metal-oxide FETS ("MOSFETs") have been the FET of choice for such ROMs because of the superior impedance characteristics which they exhibit. One well-known structure for achieving high storage density within a FET ROM requires the individual FETs to be fabricated so that they are connected in series. While this effectively reduces the area occupied by the FETs, it requires the use of an elaborate scheme to access and read the contents of the memory. Furthermore, the time required to access and read this type of series FET ROM is typically proportional to the square of the number of individual FETs connected in series. Obviously this results in increasingly greater delays as memory size is increased.

An alternative to the serial FET ROM architecture is a parallel arrangement comprised of multiple groupings of FETs. The FETs within each grouping are connected in a parallel to a single output called a bit line. The time required to access and read such ROMs is proportional to the number of FETs connected in parallel to each bit line. While this parallel architecture provides an improvement in access and read time over the serial architecture, it poses a problem with respect to maximizing the number of memory sites (i.e., individual transistors) which can be fabricated on a semiconductor chip of any given size.

Ideally, it would be desirable to have a fabricated device (in this case, an individual FET) fit within the minimum period lattice structure of the particular semiconductor chip being produced. The minimum size of a feature that can be reliably fabricated upon a semiconductor chip is a function of the particular materials and processing techniques employed to produce that chip. Regardless of what the minimum feature size is, the minimum period of any regular square lattice structure that can be fabricated on a semiconductor chip is equal to approximately three times this minimum feature size. In other words, the most compact lattice structure that could be fabricated would consist of lines one minimum feature size wide, separated from each other by a distance equal to one minimum feature size. If one bit of information were stored at every intersection of this compact lattice, the highest possible data storage density for that particular technology would be achieved.

Unfortunately, a conventional parallel FET ROM architecture cannot be fabricated to conform with a minimum lattice structure. This is due to a design peculiarity of typical FETs which requires current to flow between the FET source and drain regions in a direction parallel to the surface of the semiconductor material that composes the FET. The parallel current flow is dictated by the placement of the FET source and drain, which are diffused or implanted into the surface of a semiconductor material. The semiconductor material between the source and drain provides a conductive channel, parallel to its surface, which serves as a gate for the FET.

SUMMARY OF THE INVENTION

The aforementioned problems are solved, in accordance with the principles of the invention, by providing a ROM that utilizes junction field-effect transistors ("JFETs") having a narrow conductive columnar channel, orthogonally oriented with respect to the surface of the semiconductor material composing the JFET. A fixed-position ion beam is employed to create this narrow gate channel, which extends between the JFET's source and drain contact. Employing such JFETs as memory sites within a semiconductor ROM circuit allows for an architecture that conforms to a minimum lattice structure layout. In addition, the resulting ROM offers high speed access of data.

Although JFETs have not been utilized as the transistor of choice within ROMs because of their seemingly inferior performance when compared to MOSFETs, the invention provides a novel architecture which significantly enhances the practicality of the JFET as a memory device.

DETAILED DESCRIPTION

Figure 1:
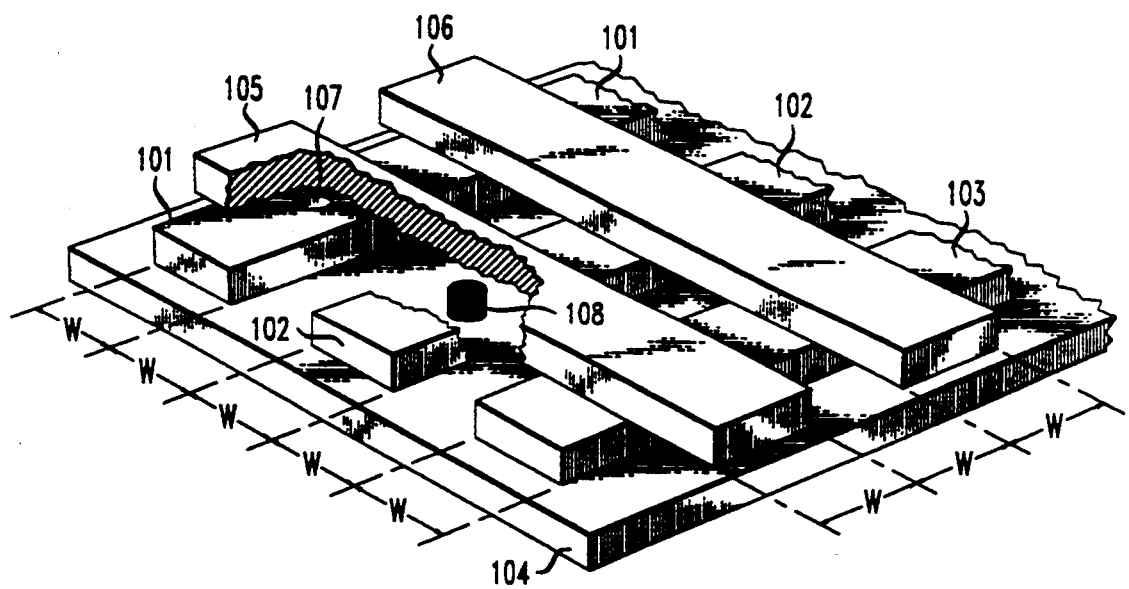
FIG. 1 shows a partial cross-sectional view of a portion of a semiconductor memory device incorporating an embodiment of the invention.

FIG. 1 is an illustration providing a partial cross-sectional view of a portion of a semiconductor memory device incorporating an embodiment of the invention. As shown, p-type conductive strips 101, 102 and 103 are situated upon n-type conductive substrate 104. Metal runners 105 and 106 are orient,ed orthogonally to the p-type conductive strips. The p-type conductive strips have a width W, and are separated from adjacent p-type conductive strips by a distance W; where W is the minimum feature size for the particular fabrication technique being employed. Likewise, the width of, and separation between, metal runners 105 and 106 are also W. Although it appears from FIG. 1 that metal runners 105 and 106 are in direct contact with p-type conductive strips 101, 102, and 103, the metal runners remain electrically isolated from the p-type conductive strips because of a thin non-conductive oxide (not shown in FIG. 1) on the surface of the p-type conductive strips.

As also shown, vertically-oriented columns of n-type conductive material 107 and 108, each having a radius of R (Where 2R is less than W), are situated beneath the areas where metal runner 105 overlays conductive strips 101 and 102, respectively. These n-type conductive columns are orthogonally oriented with respect to the surface of n-type conductive substrate 104, conductive strips 101 and 102, and metal runners 105 and 106. Each of these n-type columns serves to provide an n-type conductive path between metal runner 105 and n-type conductive substrate 104. In contrast, no such n-type column exists beneath the area where metal runner 105 overlays p-type conductive strip 103. It is the presence or absence of these columns of n-type material beneath the areas where the metal runners intersect the p-type conductive strips which serves to indicate digital data. In particular, the presence of an n-type column indicates a logical value of 0, while the absence of an n-type column indicates a logical value of 1. Each intersection between a metal runner and a p-type conductive strip serves as a one-bit ROM.

Figure 2:
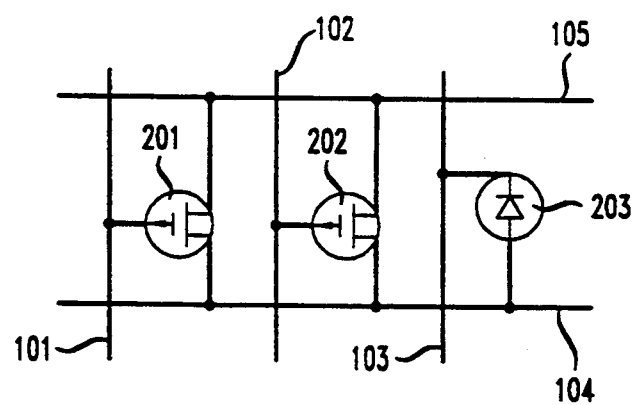
FIG. 2 shows a schematic illustration of the equivalent circuit for a portion of the semiconductor memory device of FIG. 1.

FIG. 2 provides a schematic illustration of the equivalent circuit for three of the one-bit ROMs illustrated in FIG. 1. JFET 201 is formed by p-type conductive strip 101 and n-type column 107. The drain contact for transistor 201 is provided by metal runner 105, and the source contact for the JFET is provided by n-type conductive substrate 104. Similarly, JFET 202 is formed by p-type conductive strip 102 and n-type column 108, with metal runner 105 serving as a drain contact, and n-type conductive substrate 104 serving as a source contact. The channels of each of these JFETs are formed by the respective n-type columns. The gate of each JFET is formed by the material of the p-type conductive strip surrounding the n-type channel. As stated above, there is no n-type column beneath the area where metal runner 105 overlays p-type conductive strip 103. Therefore, diode 203 (as opposed to a JFET) is formed by p-type conductive strip 103 and n-type conductive substrate 104. There is no electrical contact between metal runner 105 and diode 203.

To read the value of the digital information stored in the one-bit ROM at the intersection of p-type conductive strip 101 and metal runner 105, the voltage between p-type conductive strip 101 (the gate contact of JFET 201) and n-type conductive substrate 104 (the source contact of JFET 201) is set to zero. At the same time, a negative voltage of sufficient potential to pinch-off current flow within the channel of JFET 202 is applied between p-type conductive strip 102 (the gate contact of JFET 202) and n-type conductive substrate 104 (the source contact of JFET 202), and between p-type conductive strip 103 and n-type conductive substrate 104. The pinch-off voltage is approximately given by:

$$V_G = \frac{qnR^2}{2\epsilon_S} ;$$

where q is the electronic charge ($1.6 \times 10^{-19}$ coulomb), $\epsilon_S$ is the dielectric constant of silicon ($1.0 \times 10^{-12}$ farad/cm), R is the radius of the JFET channel (n-type column 108 in the case of JFET 202), and n is the dopant concentration of the material within the JFET channel.

Under these applied voltages, a low resistance path will be provided between metal runner 105 and n-type conductive substrate 104 by n-type column 107 within JFET 201. Contrastingly, no such low resistance path between metal runner 105 and n-type conductive substrate 104 will be evident through JFET 202 (which is pinched-off by voltage $V_G$), or through diode 203 (metal runner 105 is electrically isolated from this diode). Therefore, if a resistance measurement taken between metal runner 105 and n-type conductive substrate 104 under these conditions yielded a low value, it could be concluded that a logical 0 was stored within the one-bit ROM at the intersection of p-type conductive strip 101 and metal runner 105.

If the data stored within the ROM at the intersection of p-type conductive strip 103 and metal runner 105 is to be read, the voltage between p-type conductive strip 103 and n-type conductive substrate 104 is set to zero. At the same time, a negative voltage of sufficient potential to pinch-off current flow within the channel of JFETs 201 and 202 is applied between p-type conductive strip 101 (the gate contact of JFET 201) and n-type conductive substrate 104 (the source contact of JFET 201), and between p-type conductive strip 102 (the gate contact of JFET 202) and n-type conductive substrate 104 (the source contact of JFET 202).

With these voltages applied, neither JFET 201, JFET 202, nor diode 203 will provide a low resistance path between metal runner 105 and n-type conductive substrate 104 (both JFETs will be pinched-off). Therefore, if a resistance measurement taken between metal runner 105 and n-type conductive substrate 104 under these conditions yielded a relatively high value, it could be concluded that a logical 1 was stored within the one-bit ROM at the intersection of p-type conductive strip 103 and metal runner 105.

As described above, each intersection between metal runner 105 and p-type conductive strips 101, 102 and 103 serves as a single bit ROM. Similarly, single bit ROMs are also located at the intersection of metal runner 106 and the three p-type conductive strips (101, 102 and 103—see FIG. 1). The configuration and operation of these ROMs would be identical to those associated with metal runner 105. However, when reading the content of these ROMs, resistance measurements would have to be taken between metal runner 106 and n-type conductive substrate 104. Although FIG. 1 provides an illustration of a device containing only six one-bit ROMs, it will be clear to those skilled in the art that the basic architecture of this device would, in a commercial product, be extended to provide semiconductor memory devices consisting of many hundreds of thousands, or multiple millions of one-bit ROMs arranged in a minimum period lattice structure upon a single semiconductor chip.

Present, well-known methods of semiconductor fabrication will facilitate the production of the semiconductor memory device of FIG. 1. In one particular method of fabrication, p-type conductive strips 101, 102 and 103 are fashioned upon n-type conductive substrate 104 by growing an epitaxial layer of p-type conductive material upon n-type conductive substrate 104. Selected regions of this epitaxial layer are then etched away so that parallel p-type conductive strips of width W are formed. A layer of protective oxide is then grown upon the surface of the p-type conductive strips. A hole is then opened in the protective oxide at each site upon the p-type conductive strips where a one-bit ROM storing a logical 0 is to be located. No such holes are opened in the protective oxide at the sites where one-bit ROMs storing logical 1s are to be located. These holes will have a diameter approximately equal to W (as W Was defined as the minimum feature size the particular fabrication technique being employed could produce). Next, n-type polysilicon is deposited over the surface of the oxide and the regions of the p-type conductive strips exposed through the holes in the oxide. This n-type polysilicon layer is then oxidized, effectively reducing the size of the holes as this oxide grows upon the n-type polysilicon walls of each hole. Following this oxidation, JFETs are formed by ion implanting a column of n-type material into the p-type conductive strips at each reduced diameter hole. This implantation is performed using with a narrow, fixed-position ion beam focused upon each region of p-type strip exposed through the holes in the protective oxide (the oxidized n-type polysilicon is employed as a mask during this process). The ion beam is kept in a fixed position during implantation to ensure a narrow column, and the orientation of the beam is kept orthogonal to the surface of the p-type strips to ensure the orthogonality of each implanted column. To increase surface conductivity of the implanted columns, a thin layer of n-type material is formed upon the exposed surface of the columns and surrounding p-type conductive strips. Metal runners 105 and 106 are then fabricated so that they contact each of these n-type regions at the site of each ROM storing a logical 0. For ROMs storing logical 1s, the metal runners contact oxidized n-type polysilicon (which serves as an insulator).

The doping concentration of the implanted n-type column must be chosen so that the implanted column is not destroyed as a result of impurity diffusion effects resulting from post-implantation processing of the semiconductor device (i.e., the fabrication of the metal runners and/or any annealing performed to activate the implanted column of n-type material). Avoiding such unwanted effects by "thermal budgeting" is well known, and it will be clear to those skilled in the art of semiconductor processing as to the particular dopant concentrations needed to ensure the fabrication of a workable device.

Figure 3:
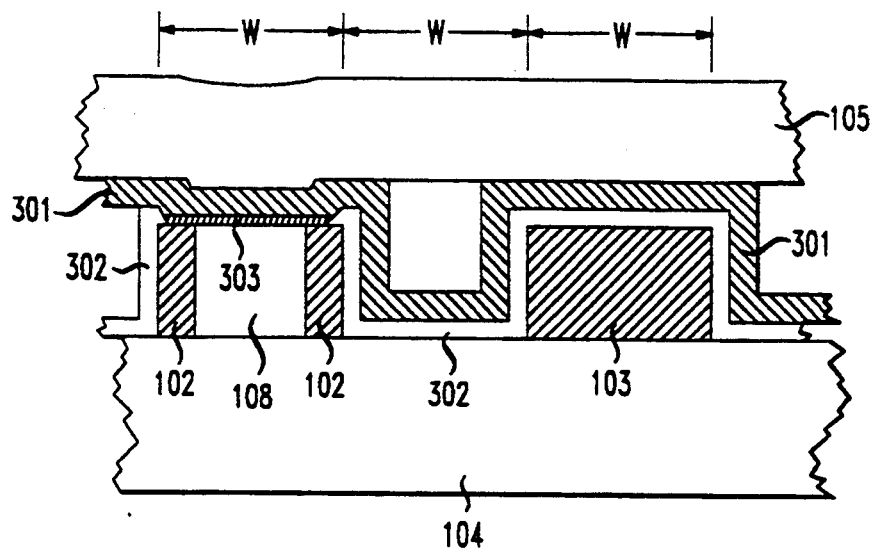
FIG. 3 shows a simplified cross-sectional view of a portion of the semiconductor device of FIG. 1.

FIG. 3 provides a simplified cross-sectional view of the one-bit ROMs at the intersection of metal runner 105 with p-type conductive strips 102 and 103. As shown, the ROM at the intersection of metal runner 105 and p-type conductive strip 102 consists of a JFET including n-type column 108. As described above, this n-type column was implanted into p-type conductive strip 102 through a layer of oxidized n-type polysilicon (301), and a hole opened in a protective oxide (302). An n-type conductive layer (303) was then formed upon the exposed surface of the n-type column and the surrounding p-type region. The ROM at the intersection of metal runner 105 and p-type conductive strip 103 does not include a JFET, as a hole was not opened in protective oxide 302 over p-type conductive strip 103 to allow the implantation of an n-type column.

Figure 4:
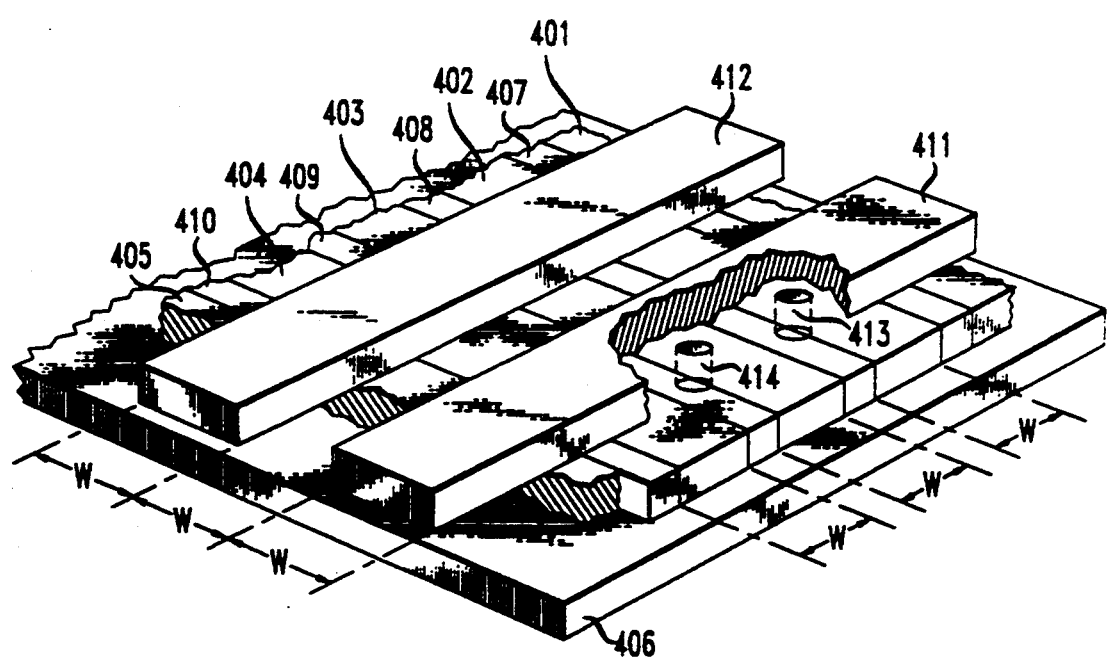
FIG. 4 shows a partial cross-sectional view of a semiconductor memory device incorporating an alternate embodiment of the invention.

A partial cross-sectional view of a ROM incorporating an alternate embodiment of the invention is shown in FIG. 4. As illustrated, p-type conductive strips 401, 402, 403, 404 and 405 are situated upon a conductive substrate 406. Adjacent to each of these p-type strips are n-type strips 407, 408, 409 and 410, which serve to isolate the p-type strips from each other. Metal runners 411 and 412 are orthogonally oriented with respect to the p-type and n-type strips. The p-type strips have a width of W, where W is the minimum feature size for the particular fabrication technique being employed. However, the n-type strips are ion implanted (in a manner similar to that described for the semiconductor memory devices shown in FIGS. 1 and 3), and may therefore have a width less than W. The width of, and the separation between metal runners 411 and 412 are also equal to W. Although it appears that metal runners 411 and 412 are in direct contact with the p-type and n-type conductive strips, the metal runners are isolated from the strips by a thin non-conductive oxide (not shown in FIG. 4). A one bit ROM exists at each intersection of a metal runner and a p-type strip.

As also shown, vertically-oriented columns of n-type conductive material 413 and 414, each having a radius of R (where 2R is less than W), are situated beneath the areas where metal runner 411 overlays p-type conductive strips 402 and 403, respectively. Each of these n-type columns serves to provide an n-type conductive path between metal runner 411 and n-type conductive substrate 406. No such n-type column is shown to exist beneath the area where metal runner 411 overlays p-type conductive strip 404. Each intersection between a metal runner and a p-type conductive strip serves as a one-bit ROM, wherein the presence of an n-type column indicates a logical value of 0, and the absence of an n-type column indicates a logical value of 1.

Electrically, the equivalent circuit for the three one-bit ROMs associated with the portion of metal runner 411 illustrated in FIG. 4 would be similar to the circuit illustrated in FIG. 2. A first JFET would be formed by p-type conductive strip 402 and n-type column 413. Metal runner 411 serves as the drain contact for this JFET, and the source contact would be n-type conductive substrate 406. Similarly, a second JFET is formed by p-type conductive strip 403 and n-type column 414, with metal runner 411 serving as a drain contact, and n-type conductive substrate 406 serving as a source contact. The channels within each of these JFETs are formed by the respective n-type columns. The gate of each JFET is formed by the material of the p-type conductive strip surrounding the n-type channel. A diode is formed by p-type conductive strip 404 and n-type conductive substrate 406.

To read the value of the digital information stored within the one-bit ROM at the intersection of p-type conductive strip 402 and metal runner 411, the voltage between p-type conductive strip 402 (the gate contact of the first JFET) and n-type conductive substrate 406 (the source contact of the first JFET) is set to zero. At the same time, a negative voltage of sufficient potential to pinch-off current flow within the channel of the second JFET is applied between p-type conductive strip 403 (the gate contact of the second JFET) and n-type conductive substrate 406 (the source contact of the second JFET). Similar negative potentials are also applied between p-type conductive strips 401, 404 and 405 and n-type conductive substrate 406. The negative potentials being applied to the p-type conductive strips may result in condition called "punchthrough," which occurs when the depletion regions resulting from the applied negative voltages extend through the entirety of the n-type regions separating the p-type strips. This condition may result in current flowing from p-type strip 402 to p-type strips 401 and 403 (via n-type strips 407 and 408), and cause a false reading of the digital information stored at the intersection of strip 402 and runner 411. To mitigate the effects of punchthrough, regulated current paths to n-type conductive substrate 406 from p-type strips 402 and 404 are established (illustrated as the paths including current generators 415 and 416). To mitigate the effects of punchthrough, regulated current paths to n-type conductive substrate 406 from p-type strips 401 and 403 are established. Enough current is permitted to flow through each so that the depletion regions are controlled, but not so much as to allow the negative potential between conductive substrate 406 and p-type strips 401 and 403 to fall below the minimum level required to ensure pinch-off.

Under these applied voltages, a low resistance path will be provided between metal runner 411 and n-type conductive substrate 406 by n-type column 413. Contrastingly, no such low resistance path between metal runner 411 and n-type conductive substrate 406 will be evident through the second JFET (which is pinched-off), or through the diode formed by p-type conductive strip 404 and n-type conductive substrate 406. Therefore, a resistance measurement taken between metal runner 411 and n-type conductive substrate 406 under these conditions would yield a low reading, and indicate a logical 0 stored within the one-bit ROM at the intersection of p-type conductive strip 403 and metal runner 411.

As with the previously described embodiment, data stored within other ROMs of the memory device of FIG. 4 could be read by applying a zero voltage to the p-type conductive strip associated with a particular ROM, and a negative voltage to all other p-type conductive strips. A resistance measurement between the metal runner associated with that particular ROM and n-type conductive substrate 406 would reflect the logical value stored within that ROM. A low resistance measurement would indicate the presence of a JFET and logical value of 0. Contrastingly, a high resistance measurement would indicate that no JFET exists at that runner and strip intersection, and a logical value of 1 is stored there.

The fabrication of the semiconductor memory device of FIG. 4 is similar to that of the device illustrated in FIG. 1. A p-type conductive region is fashioned upon n-type conductive substrate 406 through well-known epitaxial methods. N-type conductive strips 407–410 are then ion implanted through this p-type conductive region. This implantation also serves to separate the epitaxial p-type conductive region into p-type conductive strips 401–405. A layer of protective oxide is then grown upon the surface of the p-type and n-type conductive strips. A hole (having a diameter approximately equal to W) is then opened in the protective oxide at each site upon the p-type conductive strips where a one-bit ROM storing a logical 0 is to be located. N-type polysilicon is then deposited over the surface of the oxide and oxidized to reducing the size of the holes. JFETs are then formed by ion implanting a column of n-type material into the p-type conductive strips at each reduced diameter hole. Metal runners 411 and 412 are then fabricated so that they contact each of these implanted columns of n-type material at the site of each ROM storing a logical 0. For ROMs storing logical 1s, the metal runners contact oxidized n-type polysilicon (which serves as an insulator).

It will be understood that the particular embodiment described above is only illustrative of the principles of the present invention, and that various modifications could be made by those skilled in the art without departing from the scope and spirit of the present invention, which is limited only by the claims that follow.

One such modification would include extending the invention to architectures encompassing many hundreds of thousands, or multiple millions of one-bit ROMs fabricated in a minimum period lattice structure upon a semiconductor chip. Furthermore, it will also be evident that the particular conductivity types specified for the various regions in the above embodiments could be reversed, as long as the polarity of any applied voltages were also reversed. Other embodiments of the invention could be realized by substituting conductive semiconductor material runners for the metal runners. These semiconductor material runners would be fabricated from material having the same conductivity type as the columns of material implanted within the semiconductor memory device to indicate logical 0s.

I claim:

1. A method of fabricating a read-only memory device comprising the steps of:
    forming a plurality; of semiconductor strips upon a conductive ground plane, said strips having a first polarity of conductivity;
    ion implanting, with a fixed beam, a dopant material to create at least one substantially columnar semiconductor channel extending through at least one of said semiconductor strips, each of said implanted channels having a polarity of conductivity opposite that of said first polarity of conductivity, and each of said implanted channels having one end contacting said conductive ground plane, and an opposite end evident upon an exposed surface of said semiconductor strips;
    forming a plurality of conductive strips, said conductive strips being situated upon said plurality of semiconductor strips so that all of said exposed ends of said implanted columns contact at least one of said conductive strips.

2. The method of claim 1 wherein said conductive strips are formed so that they are positioned substantially orthogonal to said plurality of semiconductor strips.

3. A method of fabricating a read-only memory device comprising the steps of:
    forming a semiconductor layer upon a conductive ground plane, said semiconductor layer having a first polarity of conductivity;
    ion implanting a plurality of parallel linear regions extending through said semiconductor layer, each of said implanted linear regions having a polarity of conductivity opposite that of said first polarity of conductivity, and each of said implanted linear regions extending from the surface of said semiconductor layer through to said conductive ground plane so as to divide said semiconductor layer into a plurality distinct semiconductor strips;
    ion implanting, with a fixed beam, a dopant material to create at least one substantially columnar semiconductor channel extending through at least one of area of said semiconductor strips, each of said implanted channels having a polarity of conductivity opposite that of said first polarity of conductivity, and each of said implanted channels having one end contacting said conductive ground plane, and an opposite end evident upon an exposed surface of one of said semiconductor strips;
    forming a plurality of conductive strips, said conductive strips being situated upon said plurality of semiconductor strips so that all of said exposed ends of said implanted columns contact at least one of said conductive strips.

4. The method of claim 3 wherein said conductive strips are formed so that they are positioned substantially orthogonal to said plurality of semiconductor strips.

5. A method of fabricating a field-effect transistor comprising the steps of:
- forming a semiconductor gate area having a first polarity of conductivity;
- ion implanting, with a fixed beam, a dopant material within said semiconductor gate area to create, a substantially columnar semiconductor channel, having a polarity of conductivity opposite that of said semiconductor gate area, extending through said semiconductor gate area so that opposite ends of said channel are exposed upon opposite faces of said semiconductor gate area;
- establishing a source contact to one exposed end of said implanted column;
- establishing a drain contact to the other exposed end of said implanted column.

* * * * *